United States Patent
Imai et al.

(10) Patent No.: US 10,014,151 B2
(45) Date of Patent: Jul. 3, 2018

(54) COMPOSITE CHARGED PARTICLE BEAM DEVICE

(71) Applicant: HITACHI HIGH-TECHNOLOGIES CORPORATION, Minato-ku, Tokyo (JP)

(72) Inventors: Yuta Imai, Tokyo (JP); Hideo Morishita, Tokyo (JP); Toshihide Agemura, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/548,321

(22) PCT Filed: Feb. 4, 2016

(86) PCT No.: PCT/JP2016/053305
§ 371 (c)(1),
(2) Date: Aug. 2, 2017

(87) PCT Pub. No.: WO2016/125844
PCT Pub. Date: Aug. 11, 2016

(65) Prior Publication Data
US 2018/0025885 A1    Jan. 25, 2018

(30) Foreign Application Priority Data

Feb. 6, 2015 (JP) ................................. 2015-021772

(51) Int. Cl.
*H01J 37/12* (2006.01)
*H01J 37/28* (2006.01)
(Continued)

(52) U.S. Cl.
CPC .............. *H01J 37/12* (2013.01); *H01J 37/06* (2013.01); *H01J 37/08* (2013.01); *H01J 37/20* (2013.01);
(Continued)

(58) Field of Classification Search
USPC .......................... 250/310, 306, 307, 396 R
See application file for complete search history.

(56) References Cited

U.S. PATENT DOCUMENTS

2004/0211913 A1* 10/2004 Petrov ................... H01J 37/145
  250/396 R
2009/0309025 A1   12/2009 Preikszas
(Continued)

FOREIGN PATENT DOCUMENTS

| JP | 2010-257855 A | 11/2010 |
| JP | 2013-191571 A | 9/2013 |
| WO | WO 2014/030433 A1 | 2/2014 |

*Primary Examiner* — Kiet T Nguyen
(74) *Attorney, Agent, or Firm* — Miles & Stockbridge P.C.

(57) ABSTRACT

This composite charged particle beam device comprises a first charged particle beam column (6), a second charged particle beam column (1) which is equipped with a deceleration system, and is equipped with a detector (3) inside the column, a test piece stage (10) on which a test piece (9) is placed, and an electric field correction electrode (13) which is provided around the tip of the first charged particle beam column, wherein the electric field correction electrode is an electrode that corrects the electric field distribution formed in the vicinity of the test piece, and the electric field correction electrode is positioned between the test piece and the first charged particle beam column, and on the opposite side from the second charged particle beam column with respect to the optical axis of the first charged particle beam column.

15 Claims, 9 Drawing Sheets

(51) Int. Cl.
*H01J 37/06* (2006.01)
*H01J 37/20* (2006.01)
*H01J 37/08* (2006.01)

(52) U.S. Cl.
CPC ........... *H01J 37/28* (2013.01); *H01J 2237/08* (2013.01); *H01J 2237/2801* (2013.01)

(56) References Cited

U.S. PATENT DOCUMENTS

| | | |
|---|---|---|
| 2012/0043463 A1 | 2/2012 | Agemura et al. |
| 2013/0001420 A1* | 1/2013 | Nomaguchi .......... H01J 37/244 250/310 |
| 2014/0361165 A1* | 12/2014 | Sed'a ...................... H01J 37/12 250/307 |
| 2015/0221468 A1 | 8/2015 | Nomaguchi et al. |

* cited by examiner

COMPOSITE CHARGED PARTICLE BEAM DEVICE

TECHNICAL FIELD

The present invention relates to a composite charged particle beam device.

BACKGROUND ART

A scanning electron microscope (SEM) detects signal electrons generated when a converged irradiation electron beam irradiates and scans a sample, and displays a signal intensity at each irradiation position in synchronization with a scan signal of the irradiation electron beam, thus obtaining a two-dimensional image of the scan area on the sample surface. An FIB-SEM composite device is known in which a focused ion beam device (FIB) for processing a sample by emitting and scanning a focused ion beam on the sample is combined with an SEM to form an integrated device. In this FIB-SEM, the state of processing with the FIB can be observed with a high level of resolution by the SEM, so that this enables more precise shape processing of a sample such as preparation of a thin film sample for observation with Transmission Electron Microscope (TEM).

In recent years, the FIB-SEM has been widely used for processing samples of wafer shapes at the development site of the most advanced semiconductor devices. In such fields, low-acceleration observation performance with irradiation energy of about 1 keV or less is regarded as important for the purpose of avoiding charging and damage of the sample caused with the electron beam irradiation at the time of SEM observation and obtaining sample information about the top surface. However, with a generally-available SEM, chromatic aberration increases in the low acceleration region, and a high resolution cannot be obtained. In order to reduce this chromatic aberration, it is effective to use a decelerating optical system that allows the irradiation electron beam to pass through the objective lens at a high speed and decelerates and emits the irradiation electron beam just before the sample.

The decelerating optical system is roughly divided into a retarding method and a boosting method depending on a difference in voltage application method. In the retarding method, the objective lens side of the SEM column is kept at the ground potential and a negative voltage is applied to the sample. In the boosting method, a tubular electrode for applying a positive voltage is provided along the inner wall of the inner magnetic path of the objective lens of the SEM, and the sample is set to the ground potential. Both of the retarding method and the boosting method are characterized in that the area of the irradiation electron beam at electron source side from the objective lens is at a higher potential than the sample, and the electric field which is formed by this potential difference and in which the irradiation electron beam decelerates toward the sample is used as a lens field. As the irradiation electron beam passes through the magnetic lens at a high speed, the objective lens aberration can be reduced in a low acceleration range compared with the case where there is no decelerating electric field, and a high resolution can be obtained. Further, the signal electrons generated from the sample are accelerated and converged by this electric field and pass through the SEM objective lens. In such a system, a detector (hereinafter referred to as a detector in the SEM column) disposed in a space set to a higher electric potential than the sample in order to generate a decelerating electric field can efficiently detect the signal electrons having passed through the objective lens.

The improvement effect of resolution and signal electron detection rate with the decelerating optical system depends on the intensity of the decelerating electric field in the vicinity of the sample, and the stronger the electric field, the more effective it is. In order to improve the resolution and detection efficiency, the potential difference for forming the decelerating electric field may be increased. However, when the decelerating optical system is applied to the SEM, the axial symmetry of the electric field distribution with respect to the optical axis of the SEM becomes important. If the distribution of the decelerating electric field becomes non-axisymmetric due to a structure placed around the SEM column or an inclined sample such as an FIB column, the observation performance of the SEM is remarkably deteriorated.

In the field of semiconductors, when a wafer-shaped sample is processed with FIB, the sample surface is arranged perpendicular to the FIB optical axis, and the asymmetry of the electric field formed near the sample as the SEM decelerating electric field is increased. Since there is no influence as described above in a system not employing the ordinary decelerating optical system, the irradiation electron beam and the irradiation ion beam reach in proximity to the intersection point of the SEM optical axis and the FIB optical axis on the sample (hereinafter referred to as a coincident point) without depending on the unevenness of the surface of the sample and the inclination situation. However, when the symmetry of the electric field distribution in the vicinity of the sample is not good, the trajectories of the irradiation electron beam and the irradiation ion beam are bent and are not guided to the coincident point on the sample. In addition, not only the displacement of the trajectory increases but also the beam diameter at the irradiation position increases due to an increase in the asymmetric aberration component, resulting in degradation of the resolution at the time of SEM observation. Furthermore, the orbit of the signal electron is disturbed, making it difficult for the signal electron to reach the detector in the SEM column. As described above, the asymmetric electric field distribution caused by the SEM decelerating electric field is a factor of deteriorating the irradiation system and detection system performance of the SEM and the FIB.

For the above reasons, in the case of obtaining a high resolution with a device configuration such as FIB-SEM which uses a large inclination angle of a sample, a lens system that reduces aberrations by leakage of a magnetic field from an objective lens is often used without applying a deceleration optical system. However, when there is a magnetic field leakage from the SEM objective lens in the vicinity of the sample, the orbit of the isotope ion contained in the irradiation ion beam of the FIB is separated, so that there is a problem in that it is impossible to perform simultaneous observation with the SEM during the FIB processing. The above problem is avoided by applying the boosting method to the objective lens of the SEM having a small magnetic field leakage so as to minimize the asymmetric electric field distribution formed around the sample.

PTL 1 describes an example in which a shield electrode is provided between an annular electrode provided at the tip of the SEM and the FIB optical axis in an FIB-SEM having such SEM mounted thereon. In PTL 1, a change in the position where the irradiation electron beam arrives due to an asymmetric electric field leaking from the end portion of the objective lens is suppressed by applying a voltage to the annular electrode, and changes in the position where the ion beam arrives due to the electric field formed by applying the voltage to the annular electrode are suppressed by the shield electrode.

CITATION LIST

Patent Literature

PTL 1: Japanese Patent Laid-Open No. 2013-191571

SUMMARY OF INVENTION

Technical Problem

The SEM described in PTL 1 is configured so that the asymmetry of the leakage electric field becomes relatively small, and the leakage electric field from the objective lens of the SEM is limited to the vicinity of the sample. In the case of such system, the electric field in the direction traversing the FIB optical axis in the vertical direction is reduced by the electrode arrangement described above, and the amount of change in the beam arrival position can be suppressed into a desired range.

However, in the SEM with a lower level of electric field leakage and magnetic field leakage from the objective lens, the focal length of the objective lens becomes long and the objective lens aberration increases, so a high resolution cannot be obtained particularly in a low acceleration region. As the trapping efficiency also decreases due to the leakage electric field of the signal electrons generated in the sample, the signal detection rate of the signal electron passing through the objective lens with the detector is lower than that achieved with a SEM with a higher level of electromagnetic field leakage. In addition, since the main surface of the electrostatic lens is formed at a position distant from the sample, the distance between the end of the objective lens and the objective lens that can be observed in the low acceleration region (Working Distance) is limited to be a relatively short distance.

On the other hand, when the shield electrode described in PTL 1 is applied to a SEM with a high level of electric field leakage in order to obtain a high level of observation performance in the low acceleration region, the shield electrode is required to be extended to be close enough to the sample in order to reduce the bending of the irradiation ion beam of the FIB. However, this shield electrode is a structure having a high level of asymmetry with respect to the optical axis of the SEM, resulting in an asymmetric electric field with respect to the SEM optical axis, which adversely affects the irradiation system and detection system performance of the SEM. In particular, in the arrangement where a wafer-like sample faces the SEM, it is considered that the adverse effect due to the asymmetry becomes more significant as compared with a system without any shield electrode.

More specifically, in the configuration of PTL 1, there is a trade-off relationship between the electric field shielding effect for reducing the bending of the irradiation ion beam of the FIB due to the shape of the shield electrode and the effect of improving the axial symmetry for improving the optical system performance of the SEM, and it is difficult to improve the performance of both of the SEM and the FIB.

In view of the above problem, the present invention provides a technique used with a composite charged particle beam device such as an FIB-SEM to form an appropriate electric field distribution near a sample, so that, without degrading the irradiation system performance of one of the charged particle beam devices, the optical system performance of the other of the charged particle beam devices is maintained.

Solution to Problem

For example, in order to solve the above problem, the configuration described in the claims is adopted. The present application includes a plurality of means for solving the above problems, but when an example thereof is described, a composite charged particle beam device including a first charged particle beam column, a second charged particle beam column including a deceleration optical system and a detector in a column, a sample table on which a sample is placed, and an electric field correction electrode provided around an end portion of the first charged particle beam column is provided. In the composite charged particle beam device, the electric field correction electrode is an electrode that corrects an electric field distribution formed in proximity to the sample, and the electric field correction electrode is located between the sample and the first charged particle beam column, and located at an opposite side of the second charged particle beam column with respect to the optical axis of the first charged particle beam column.

Advantageous Effects of Invention

According to the present invention, in a composite charged particle beam device, an appropriate electric field distribution is formed near a sample, so that, without degrading the irradiation system performance of one of the charged particle beam devices, the optical system performance of the other of the charged particle beam devices is maintained. Further features related to the present invention will be understood from the description of the present specification and the accompanying drawings. In addition, the problems, configurations, and effects other than those described above will be clarified by the description of the following embodiments.

DESCRIPTION OF EMBODIMENTS

Figure 1:
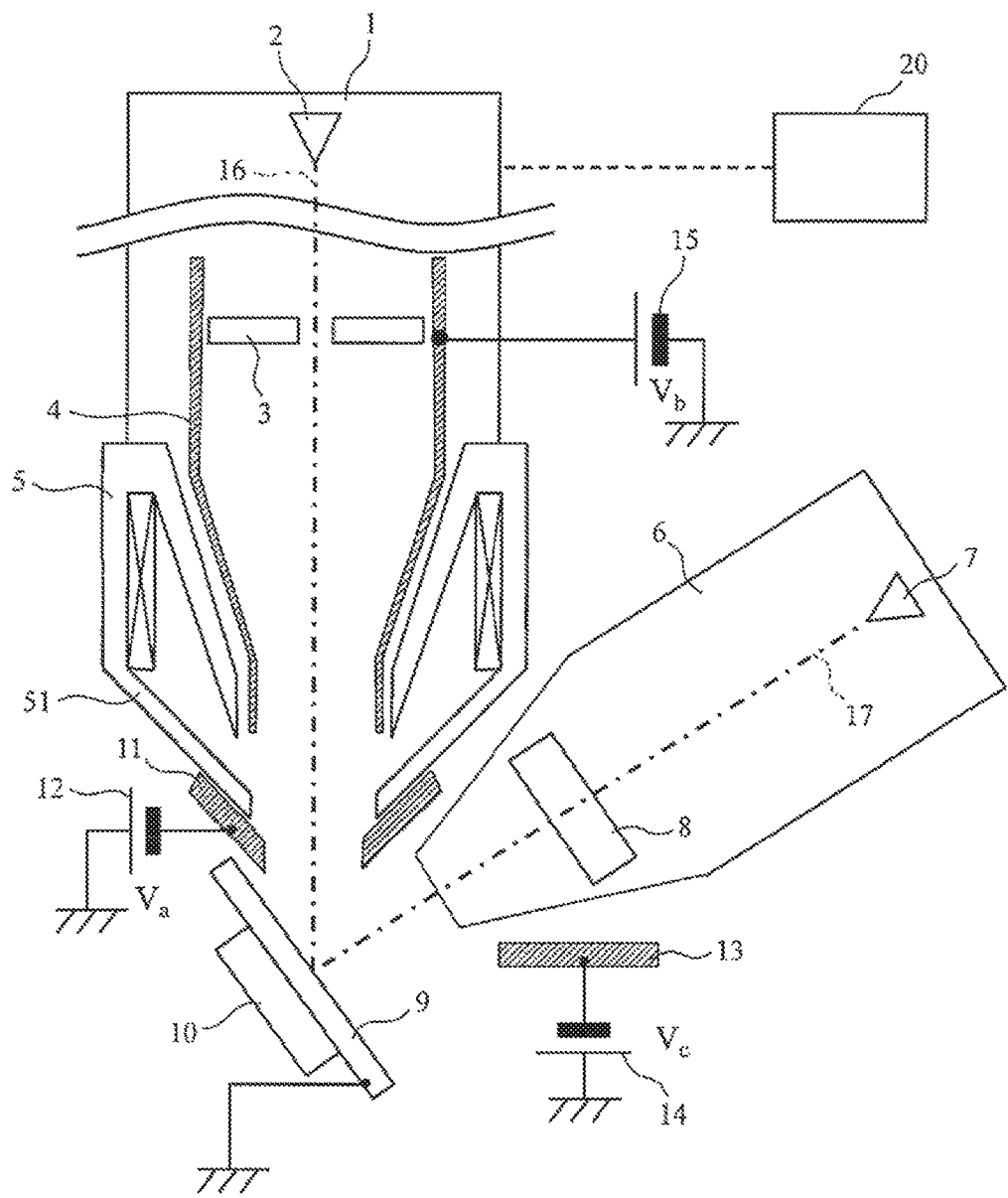
FIG. 1 is a schematic sectional view illustrating a composite charged particle beam device (FIB-SEM) according to a first embodiment.

Hereinafter, embodiments according to the present invention will be described with reference to the attached drawings. It should be noted that although the attached drawings illustrate specific embodiments according to the principle of the present invention, these are given in order to allow understanding of the present invention and should never be used to interpret the present invention in a limited way.

In all the drawings for explaining the embodiments and modifications, the same reference numerals are given to those having the same functions, and the repetitive description thereof will be omitted.

First Embodiment

FIG. 1 is a schematic sectional view illustrating a composite charged particle beam device according to the first embodiment. The composite charged particle beam device of FIG. 1 is an FIB-SEM including an FIB column (first charged particle beam column) 6 and an SEM column (second charged particle beam column) 1. Boosting means is applied to the SEM column 1 of FIG. 1.

The SEM column 1 roughly includes an electron gun 2 having a mechanism for emitting an irradiation electron beam to a sample 9, an aperture (not shown) for limiting the diameter of the irradiation electron beam, an electron lens such as a condenser lens (not shown) or an objective lens 5, a deflector (not shown) for scanning the irradiation electron beam on the sample 9, and a detector 3 for detecting the signal electron generated from sample 9.

The FIB column 6 roughly includes an ion gun 7 equipped with a mechanism for emitting the ion beam, an FIB focusing lens 8 for focusing the irradiation ion beam, and a deflector (not shown) for deflecting the irradiation ion beam.

The SEM column 1 and the FIB column 6 may include other constituent elements (lenses, electrodes, detectors, and the like) other than the above, and are not limited to the above-described configuration.

Furthermore, the FIB-SEM has a sample chamber. In the sample room, a sample table 10 having sample 9 is provided. The sample table 10 has a mechanism for tilting and moving the sample 9, and this mechanism can determine the processing area or observation area of sample 9. The sample table 10 is configured to be able to hold the surface of the sample 9 in at least two directions, i.e., a direction opposing the optical axis of the FIB column 6 and a direction opposing the optical axis of the SEM column 1. In addition, the FIB-SEM has vacuum evacuation equipment (not shown) for evacuating the column.

The FIB-SEM has a control unit 20 for controlling the entire SEM and FIB. The control unit 20 controls constituent elements of the SEM and the FIB, and executes various kinds of information processing. The control unit 20 has an image display device (not shown). The control unit 20 displays the SEM image and SIM (Scanning Ion Microscope: SIM) image generated from the information obtained from the detector 3 on the image display device.

The control unit 20 may be realized by using, for example, a general-purpose computer or may be realized as a function of a program executed on the computer. The computer includes at least a processor such as a CPU (Central Processing Unit), a storage unit such as a memory, and a storage device such as a hard disk. The processing of the control unit 20 may be realized by storing the program code in a memory and executing each program code with the processor. It should be noted that a part of the control unit 20 may be constituted by hardware such as a dedicated circuit board.

The objective lens 5 of the SEM column 1 illustrated in the present embodiment is an out lens type with a small leakage magnetic field for the sample 9. The SEM column 1 has boosting means as a deceleration optical system. More specifically, in the SEM column 1, the tubular electrode 4 is installed along the inner wall of an objective lens magnetic path 51 of the objective lens 5. The FIB-SEM has a boosting voltage source 15 for applying a voltage to the tubular electrode 4. The voltage from the boosting voltage source 15 is controlled by the control unit 20 described above. The tubular electrode 4 is set to a higher electric potential than the objective lens magnetic path 51. As a result, a deceleration electric field for the irradiation electron beam is formed between the sample-side end of the tubular electrode 4 and the sample-side end of the objective lens magnetic path 51, and when the irradiation electron beam passes through the electric field, the irradiation electron beam is configured to be gradually decelerated.

It should be noted that the boosting means may be in various forms such as a form in which the tubular electrode 4 is installed in the space in the vicinity of the objective lens 5, a form in which the tubular electrode 4 is installed in the space from the electron gun 2 to the objective lens 5, and the like. The effect of the configuration described in the present embodiment can be obtained in various boosting forms.

The gap between the tubular electrode 4 and the objective lens magnetic path 51 and the gap between the tubular electrode 4 and the column lens barrel of the SEM are configured to be electrically insulated by an insulator (not shown). In order to obtain the same effect, it is also possible to use a tubular electrode 4 made of a magnetic material as a part of the objective lens magnetic path 51. In this case, the tubular electrode 4 and the objective lens 5 are electrically insulated from each other by an insulator (not shown) within a range where the tubular electrode 4 and the objective lens 5 are magnetically coupled.

In particular, in order to obtain high resolution under an observation condition where the irradiation energy of the irradiation electron beam is 5 keV or less, it is necessary to set the tubular electrode 4 to a high electric potential with respect to the sample 9 and form a deceleration electric field. In the case of the present embodiment, the potential difference $V_b$ between the sample 9 and the tubular electrode 4 is set to about 10 kV. At this time, when the leakage electric field from the objective lens 5 of the SEM is stronger, the lens action with a shorter focal length can be obtained in the vicinity of the sample 9. This reduces the chromatic aberration caused by the passage of the irradiation electron beam through the objective lens and increases the resolution improvement effect. This resolution improvement effect is higher as WD (WD: a distance between the end of the objective lens and the sample) is shorter, especially, when WD is 10 mm or less.

In the case of the FIB-SEM, it is desirable that all work such as observation, processing and analysis can be performed with the sample fixed at the coincident point position. However, in the SEM to which the boosting method is applied, the electrostatic lens action strongly works when the irradiation energy is about 2 keV or less, and the focusable working distance is sometimes limited to a short distance. When WD is short, the space around the sample is small, and for example, it is difficult to arrange detectors of various kinds of analysis devices such as EDX (Energy Dispersive X-ray spectrometer), WDX (Wavelength Dispersive X-ray spectrometer), EBSP (Electron Back-Scattering Pattern), CL (Cathodo luminescence). In addition, at the time of the analysis, the detection solid angle of a signal emitted from the sample is also limited, and a reduction in S/N is also a problem. For this reason, it is desirable that WD be, for example, 5 mm or more in order to perform analysis. In order to avoid this problem, it is only necessary to strengthen the leakage electric field from the objective lens 5 of the SEM so that the irradiation electron beam of a low acceleration can be focused with a longer WD. As a result, analysis and observation with low irradiation energy can be performed with the same WD, and it is easy to perform operation, and the throughput is improved. In order to achieve the above object, it is desirable to be able to perform observation with an electron beam of which irradiation energy is 0.1 to 2 keV with WD of 5 to 20 mm, and it is more desirable to be able to perform observation with an electron beam of which irradiation energy is 0.1 to 1 keV with WD of 5 to 10 mm.

On the other hand, the leakage electric field of the SEM extends to the optical path of the FIB. If the symmetry of the electric field distribution near the sample is not good, the irradiation ion beam is deflected. The stronger the leakage electric field is, the greater the deflection effect becomes. For example, a configuration is assumed in which the leakage electric field is large in order to improve the SEM resolution at low acceleration, and the maximum value of the absolute value of the component of the electric field on the FIB optical axis 17 in the direction perpendicular to the FIB optical axis 17 has a value of 50 kV/m or more between the end of the FIB column 6 and the sample 9. In this case, the ion beam reaching the sample 9 with the irradiation energy of 2 keV or less reaches the position several hundred μm or more away from the desired position on the sample. It is generally difficult to correct this amount only by the electromagnetic deflector for the purpose of beam shift installed in the FIB.

In the present embodiment, the electric field at the position away from the end of the objective lens 5 of the SEM is configured to be strong. For example, the maximum value of the electric field generated by the SEM column 1 is characterized in that the absolute value of the component of the electric field on the FIB optical axis 17 in the direction perpendicular to the FIB optical axis 17 has a value of 50 kV/m or more between the end of the FIB column 6 and the sample 9. Under this condition, for example, an irradiation electron beam having an irradiation energy of 1 keV can focus on WD of 7 mm or more, and observation can be performed.

The sample table 10 has an inclination mechanism and has a function to hold the sample surface in at least two directions with respect to the SEM optical axis 16 and the FIB optical axis 17. In a typical case, when the sample 9 is in a wafer shape, the sample table 10 has a function to hold the sample surface at an angle almost perpendicular to the FIB optical axis 17 during FIB processing. During SEM high resolution observation, the sample table 10 has a function to hold the sample surface at an angle almost perpendicular to the SEM optical axis 16.

When an electron beam or ion beam irradiates the sample 9, the signal electron is detected by the detector 3 installed in the tubular electrode 4. A signal processing unit (not shown) or the control unit 20 generates a SEM image or a SIM image, respectively, based on a detection signal at the detector 3. With the electric field near the sample produced by the high voltage applied to the tubular electrode 4, the signal electrons generated from the sample 9 proceeds into the tubular electrode 4 while the signal electrons are accelerated in the direction of the objective lens 5 of the SEM. Therefore, when the detector 3 is provided inside of the SEM column 1, a high detection yield can be expected.

For example, the detector 3 is provided with an annular detection surface rotationally symmetrical with respect to the SEM optical axis 16. The detector 3 may have a plurality of detection surfaces or may be configured to detect the signal electrons separately according to the trajectory of the signal electrons. In this case, images corresponding to the energy and angle of the signal electrons when emitted from the sample 9 can be acquired. A similar image can be obtained by setting a conversion electrode and detecting charged particle generated when the signal electrons collide with the conversion electrode. A deflector based on electric field or magnetic field may be placed, and signal electrons may be led to the detector installed outside of the SEM optical axis 16 by using the deflection action.

An end electrode 11 is installed in the vicinity position of the end of the objective lens 5 of the SEM. The end electrode 11 is electrically insulated from the objective lens magnetic path 51. The FIB-SEM has an end electrode voltage source 12 for applying a voltage to the end electrode 11. For example, the end electrode 11 desirably has an axisymmetric electrode shape with respect to the SEM optical axis 16, and has an annular shape with respect to the SEM optical axis 16. The shape of the end electrode 11 is not limited thereto depending on the end shape of the FIB column 6. The end electrode 11 may be magnetically coupled with the objective lens magnetic path 51 of the SEM, and the objective lens magnetic path 51 and the end electrode 11 may be configured to function as one magnetic circuit.

Figure 4:
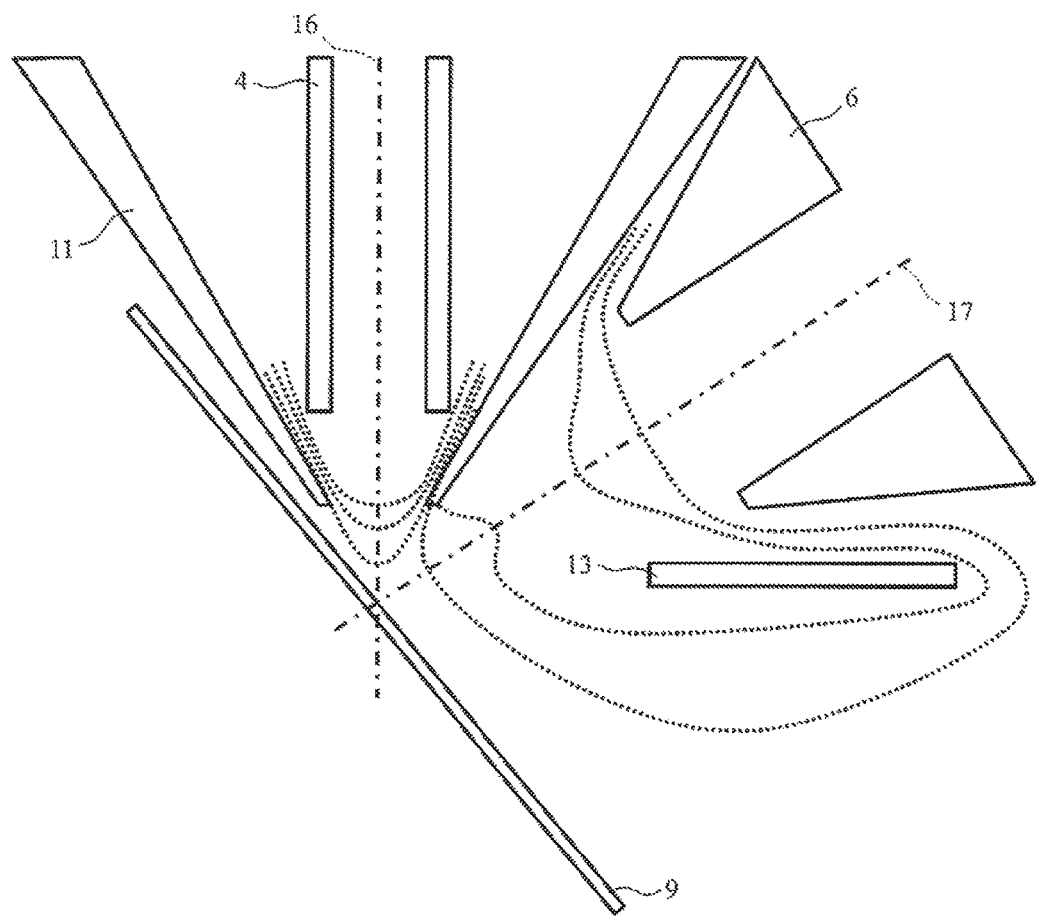
FIG. 4 is a diagram for explaining a distribution of equipotential lines in the composite charged particle beam device according to the first embodiment.

For example, as shown in FIG. 1 and FIG. 4, the end electrode 11 may be arranged to extend to the position between the tubular electrode 4 and the sample 9 and the end portion of the objective lens 5. In this configuration, the asymmetry of the electric field in the vicinity of the sample 9 can be more easily controlled. The configuration of the end electrode 11 is not limited thereto. For example, as another example, the end electrode 11 may be disposed so as not to protrude from the end portion of the objective lens 5 toward the sample 9 (for example, see FIG. 8). In this case, the leakage electric field can be easily strengthened.

A feature of the present embodiment is that an electric field correction electrode 13 for correcting the electric field distribution formed in the vicinity of the sample 9 is installed at the position around the end of the FIB column 6. The electric field correction electrode 13 is an electrode for appropriately correcting the leakage electric field from the end of the SEM column 1. The FIB-SEM has an electric field correction electrode voltage source 14 for applying a voltage to the electric field correction electrode 13.

Figure 2:
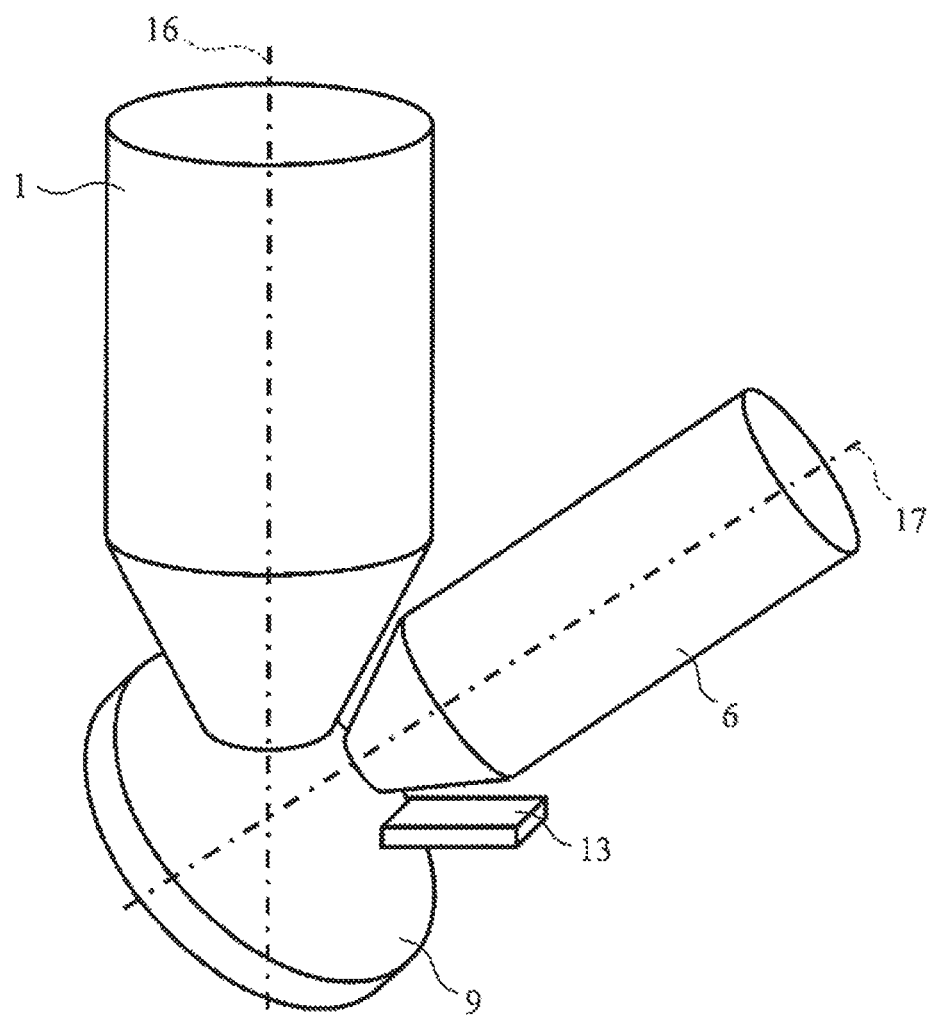
FIG. 2 is a schematic view illustrating a positional relationship between a SEM column, an FIB column, and an electric field correction electrode in a composite charged particle beam device according to the first embodiment.

FIG. 2 is a schematic view illustrating a positional relationship between the SEM column 1, the FIB column 6, and the electric field correction electrode 13. The electric field correction electrode 13 is installed between the FIB column 6 and the sample 9 and on the opposite side to the SEM optical axis 16 with the FIB column 6 in between. It is desirable that the electric field correction electrode 13 is placed at a position that does not sterically interfere even when the inclination angle of the sample 9 changes without changing WD of the sample 9 fixed to the position of the coincident point.

It is desirable that the electric field correction electrode 13 is electrically insulated from the FIB column 6. However, even when the electric field correction electrode 13 is electrically connected to FIB column 6 to have the same potential as the FIB column 6, essentially the same effects as the present embodiment can be obtained.

The electric field correction electrode 13 may be provided with a position moving mechanism for changing the position of the electrode. Depending on the position moving mechanism, the position of the electric field correction electrode 13 may be changed according to the sample shape, the sample inclination angle, and the situation of other components installed in the sample chamber. This has the advantage in that the position of the electric field correction electrode 13 can be changed flexibly according to the situation in the sample chamber.

Figure 3:
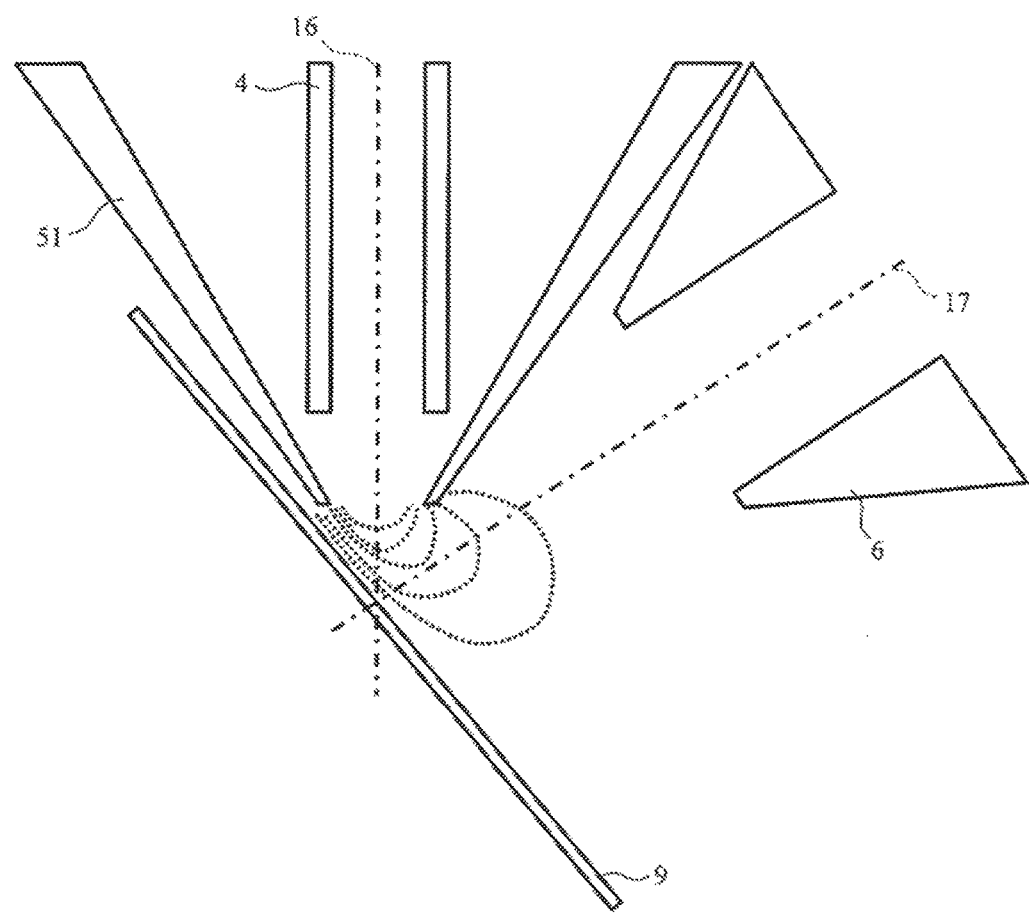
FIG. 3 is a diagram for explaining a distribution of equipotential lines in a conventional FIB-SEM.

FIG. 3 is a diagram for explaining a distribution of equipotential lines in a conventional FIB-SEM that is not equipped with the electric field correction electrode 13. FIG. 3 is a conceptual diagram illustrating a peripheral portion of a sample in the case where the sample 9 is arranged to face the FIB column 6 with the conventional FIB-SEM equipped with the SEM column to which the boosting method is applied.

In general, when processing is performed with the ion beam in the FIB-SEM, as shown in FIG. 3, the sample 9 in the form of the wafer is arranged to be inclined so as to face the FIB optical axis 17. For this reason, the sample 9 is a nonaxisymmetric structure with respect to the SEM optical axis 16. At this time, the electric field generated by the potential difference between the sample 9 and the tubular electrode 4 is asymmetric with respect to the SEM optical axis 16 and the FIB optical axis 17, and has an intensity in the lateral direction with respect to each axis.

The objective lens magnetic path 51 of the SEM, the FIB column 6, and sample 9 are all set to the ground potential, and a positive voltage is applied to the tubular electrode 4. In this case, as shown in FIG. 3, the equipotential line in the vicinity of the sample 9 is distorted and becomes a nonaxisymmetric distribution with respect to the SEM optical axis 16 and the FIB optical axis 17. With the distribution of this equipotential line, the orbit of the irradiation electron beam, the irradiation ion beam, and the signal electron is deflected. The irradiation electron beam and the irradiation ion beam reach a position different from the point that is assumed when there is no leakage electric field in the vicinity of the sample 9.

In one typical FIB-SEM shape, when a 10 kV potential difference is provided between the sample 9 and the SEM column 1, an electron beam irradiating the sample 9 with an energy of about 1 keV reaches a position 300 μm or more away from the desired position on the sample 9. The ion beam irradiating the sample 9 with an energy of 1 keV reaches a position 500 μm or more away from the desired position on the sample 9. In addition, most of the signal electrons generated from the sample 9 collide with structures near the SEM end and do not reach detectors provided in the tubular electrode 4.

FIG. 4 is a diagram for explaining a distribution of equipotential lines at the peripheral portion of the sample in the FIB-SEM according to the present embodiment. The end electrode 11 is arranged at the end position of the objective lens 5 of the SEM and the electric field correction electrode 13 is arranged near the end position of the FIB column 6.

In the example of FIG. 4, an appropriate negative voltage is applied to the end electrode 11 and the electric field correction electrode 13. By applying the negative voltage to the end electrode 11 and the electric field correction electrode 13, the electric fields around the SEM optical axis 16 and the FIB optical axis 17 are corrected so as to achieve axially symmetric distribution for each optical axis at the same time. At this time, as compared with the case where the electric field correction electrode 13 (FIG. 3) is not provided, the beam shift amount of the irradiation electron beam and the irradiation ion beam on the sample 9 is reduced. The resolution can be improved by reducing the aberration of the objective lens of the SEM. In addition, the signal electron can be appropriately directed to the detector 3 in the SEM column 1 in the tubular electrode 4.

In order to obtain this effect, the electric field correction electrode 13 plays the role of arranging the electric field leaking from the SEM column 1 so that the electric field has a distribution that is axially symmetric with respect to the FIB optical axis 17 over the area from the end portion of the FIB column 6 to the sample 9. However, it is necessary to avoid the disturbance of the electric field symmetric with respect to the SEM optical axis 16 in the vicinity of the SEM by the electric field correction electrode 13. Therefore, it is desirable that the electric field correction electrode 13 be positioned between the sample 9 and the FIB column 6 and on the side opposite to the SEM column 1 with respect to the FIB optical axis 17. A plurality of electric field correction electrodes 13 may be installed within a range that satisfies this condition.

Figure 5:
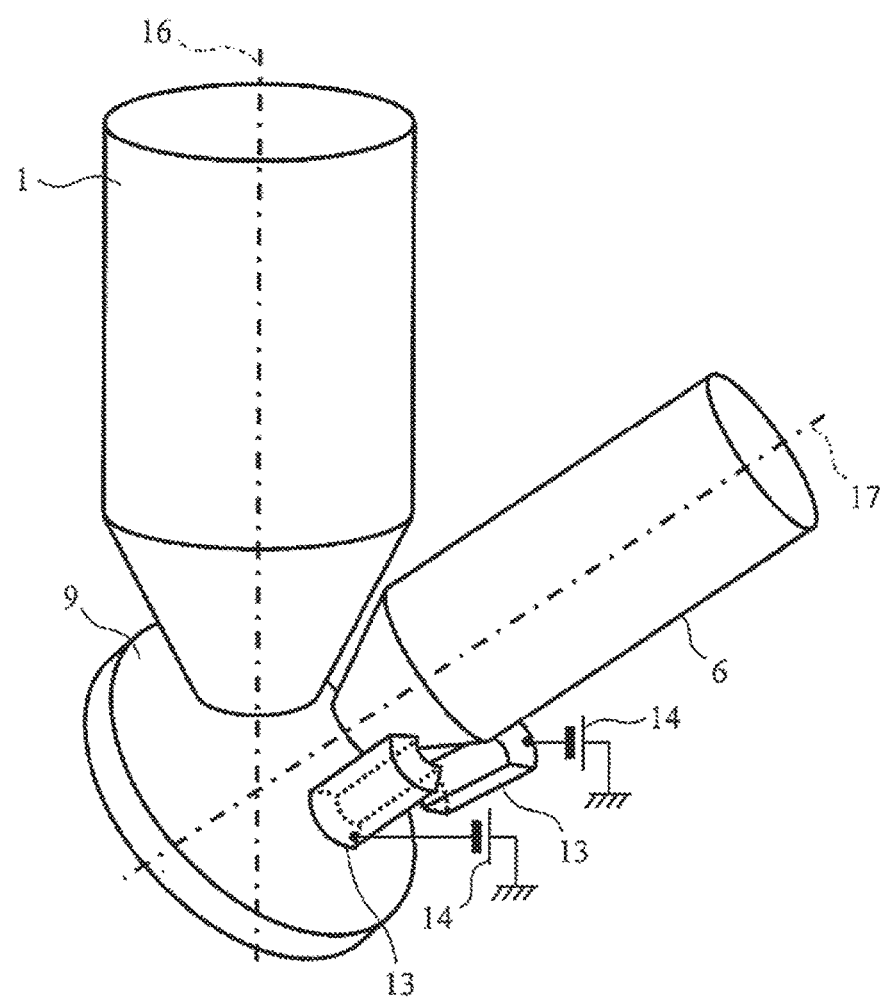
FIG. 5 is a schematic diagram showing a modification of the electric field correction electrode in the composite charged particle beam device according to the first embodiment.

FIG. 5 illustrates a modification of the electric field correction electrode 13 in the FIB-SEM according to the present embodiment. For example, as illustrated in FIG. 5, a plurality of electric field correction electrodes 13 may be arranged so as to surround the FIB optical axis 17. By using a plurality of electric field correction electrodes 13, it is easier to attain an electric field distribution with a better symmetry, and it is expected to further improve the SEM performance and the FIB performance. If structures other than the SEM column 1, the FIB column 6, and the sample 9 are present in the sample chamber, such as, for example, a gas injection nozzle, detectors of various analyzers, and the like, a plurality of electric field correction electrode 13 are effective in order to alleviate the influence on the electric field from those structures.

It is desirable that a voltage is applied to each of the electrodes 11, 13 so that the end electrode 11 and the electric field correction electrode 13 have a low potential with respect to the sample 9. This makes it possible to correct it into a more suitable electric field. For example, when a potential difference of 10 kV is provided between the tubular electrode 4 and the sample 9, typically, a voltage is applied so that the SEM end electrode 11 and the electric field correction electrode 13 are set to a negative potential of about 600 V with respect to the sample 9. As a result, the amount of change of the irradiation electron beam at the arrival position can be reduced to one tenth or less as compared with the case where a voltage is not applied. In addition, the amount of change of the irradiation ion beam arrival position can be reduced to a one severalth or less. In addition, the signal electron can be properly guided into SEM column 1.

In the case of the present embodiment, the preferred shape and the preferred application voltage of the end electrode 11 and the electric field correction electrode 13 are determined by the end shape of the objective lens 5 of the SEM, the end shape of the focusing lens 8 (for example, the objective lens, and the like) of the FIB, and the potential difference between the sample 9 and the tubular electrode 4, and are not dependent upon the acceleration voltage of the irradiation electron beam, the acceleration voltage of the irradiation ion beam, and the inclination angle of the sample 9. More specifically, even when the SEM observation condition and/or the FIB processing condition are changed, the voltage applied to the end electrode 11 and the electric field correction electrode 13 can be constant and each optical system can be controlled easily. Therefore, the present embodiment has an advantage in that it is possible to reduce the trouble of adjusting the optical axis when observation condition and/or the processing condition are changed.

Even when there is a change in the condition of the deceleration optical system (for example, voltage applied to the tubular electrode 4), only the application voltage to the end electrode 11 and the electric field correction electrode 13 may be controlled, and this enables flexibly coping with the change. The control unit 20 may control the voltage applied to the end electrode 11 and the electric field correction electrode 13. For example, the control unit 20 may control the voltage applied to the end electrode 11 and the electric field correction electrode 13 based on the voltage applied to the tubular electrode 4. As a result, even when the boosting voltage is varied, the SEM performance and the FIB performance which deteriorate due to the asymmetry of the electric field distribution can be improved according to the same principle.

The same voltage may be applied to the end electrode 11 and the electric field correction electrode 13 by optimizing the position and the shape of the end electrode 11 and the electric field correction electrode 13. It is also possible to improve the SEM performance and the FIB performance by correcting the electric field distribution near the sample 9. According to this configuration, the end electrode 11 and the electric field correction electrode 13 are connected to a common voltage source. Therefore, there is an advantage in that the voltage source can be unified and the number of voltage sources can be reduced.

According to the present embodiment, even if there are structures that are axially asymmetric with respect to the SEM optical axis (for example, a sample having a wafer shape in which the FIB or inclination status is changed, a sample with large unevenness, and the like) around the SEM column to which the deceleration optical system is applied, an appropriate electric field distribution is formed in the vicinity of the sample 9 by applying an appropriate voltage to the end electrode 11 and the electric field correction electrode 13. As a result, it is possible to simultaneously improve the SEM optical performance and the FIB optical performance. More specifically, it is possible to simultaneously improve the spot shape and the beam shift amount of the SEM irradiation electron beam, the beam shift amount of the FIB irradiation ion beam, and the detection rate of the signal electron detected at the position having passed through the SEM objective lens.

In the conventional configuration (for example, PTL 1), the electric field shielding effect for reducing the bending of the irradiation ion beam of the FIB due to the shield electrode shape and the effect of improving the axial symmetry for improving the optical system performance of the SEM is a trade-off relationship, so that it was difficult to simultaneously improve the performance of the SEM and the FIB with a system in which the leakage electric field from the SEM column is strong. In the present embodiment, even when a SEM with a large electric field leakage is mounted on an FIB-SEM, a high optical system performance of the SEM can be maintained without deteriorating the irradiation system performance of the FIB when the sample inclination angle is changed.

In particular, in the device configuration where the electric field intensity leaked between the objective lens of the SEM and the sample is strong and the irradiation electron beam of low acceleration can be focused up to a relatively long working distance, for example, the present embodiment is effective when an irradiation electron beam having an irradiation energy of 1 keV can be focused at a position (sample surface) away from the SEM column end by 5 mm or more, and more particularly, 7 mm or more.

Second Embodiment

An embodiment of an FIB-SEM equipped with an SEM to which retarding means is applied as a deceleration optical system will be explained. When the SEM column alone is considered, there is no essential difference between the boosting optical system and the retarding optical system in that both of them use the deceleration electric field based on the difference between the SEM column and the sample. More specifically, the present invention, which is effective in the boosting optical system, has the same effect for the SEM equipped with the retarding optical system.

When the FIB-SEM is considered, the difference between the boosting optical system and the retarding optical system is the difference in the potential between the sample 9 and the FIB column 6. In the case of the boosting optical system, the sample 9 and the FIB column 6 are generally placed at the same potential, so the electric field distribution formed between them is attributable to the leakage electric field from the SEM column 1.

On the other hand, in the case of the retarding optical system which applies a negative voltage to the sample 9, a potential difference occurs between the sample 9 and the FIB column 6. Therefore, as compared to the case of the boosting optical system, the electric field between the two is stronger. More specifically, when there is a nonaxisymmetric structure with respect to the FIB optical axis 17, an electric field asymmetric with respect to the FIB optical axis 17 occurs, so that the electric field intensity on the FIB optical axis 17 of the component in a direction perpendicular to the axis becomes stronger than that in a case where the boosting optical system is applied.

As described in the first embodiment, the present invention is useful when the leakage electric field from the SEM is large and the component of the electric field along the FIB optical axis 17 in a direction perpendicular to the FIB optical axis 17 is large. More specifically, in a retarding optical system in which the electric field between the sample 9 and the FIB column 6 becomes relatively strong, the effect of improving the irradiation performance of the SEM and the irradiation performance of FIB can also be obtained when the axisymmetric electric field is corrected so as to achieve a symmetrical distribution for each of the optical axes 16, 17 of the FIB-SEM. The voltage $V_a$ of the end electrode 11 and the voltage $V_c$ of the electric field correction electrode 13 required to achieve this effect are almost uniquely determined by the SEM column shape, the FIB column shape, the voltage $V_d$ applied to the sample 9, and the arrangement and the shape of the electric field correction electrode 13.

In the device to which the retarding optical system is applied, it is assumed that there is no electric field correction electrode 13 and the sample surface is inclined in the direction opposed to the FIB optical axis 17. In this case, the potential of the sample 9 is lower than the potential of the FIB column 6, and therefore, the signal electron generated when the electron beam or the ion beam irradiates the sample 9 is likely to be affected by deflection action caused by the electric field formed by the potential difference between the sample 9 and the FIB column 6 and is likely to propagate in the direction of the FIB column 6. For this reason, the detection yield in the detector 3 in the SEM column 1 is markedly reduced.

In contrast, in the present embodiment, the electric field correction electrode 13 is arranged between the sample 9 and the FIB column 6 and on the opposite side of the SEM column 1 with respect to the FIB optical axis 17. By applying a negative voltage to this electric field correction electrode 13, it is possible to guide the signal electron in the direction of the SEM column 1. The trajectory of the signal electron is determined by the SEM column shape, the FIB column shape, the arrangement and the shape of the electric field correction electrode 13, the voltage $V_a$ of the end electrode 11, and the voltage $V_c$ of the electric field correction electrode 13. More specifically, with any SEM column shape and FIB column shape, the shape and the arrangement of the electric field correction electrode 13 are optimized so that when $V_a$ is applied to the end electrode 11 and $V_c$ is applied to the electric field correction electrode 13, the signal electron reaches the detector 3 provided in the SEM column 1. As a result, the SEM irradiation system performance, the FIB detection system performance, and the signal electron detection performance can be improved at a time.

Figure 6:
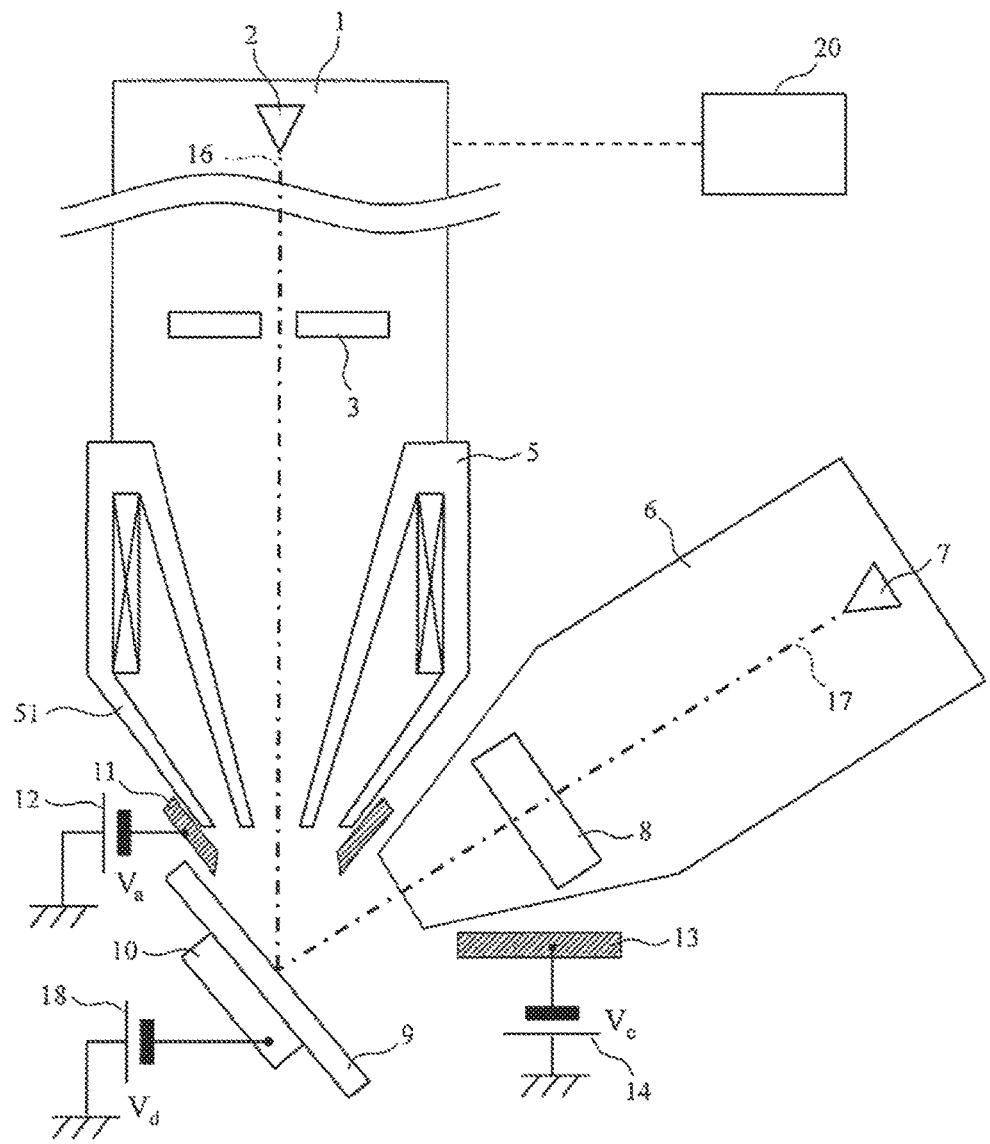
FIG. 6 is a schematic sectional view showing a composite charged particle beam device (FIB-SEM) according to a second embodiment.

FIG. 6 is a schematic configuration diagram illustrating an FIB-SEM equipped with a SEM having a retarding optical system as a deceleration optical system. The basic constituent elements of the FIB-SEM are similar to those described in the first embodiment.

The objective lens 5 of the SEM illustrated in the present embodiment is a semi-in-lens type that causes the magnetic field to pass through the sample 9. Since the objective lens 5 of the semi-in-lens type is a magnetic field lens of which focal distance is short, aberration is smaller and a high resolution can be achieved as compared with the out lens type which does not leak the magnetic field to the sample 9. Further, by using the retarding optical system, high resolution observation can be performed especially in the low acceleration region.

The sample table 10 has a voltage source 18 that can apply a voltage to the sample 9. The voltage from the voltage source 18 may be controlled by the control unit 20. In a typical case, the SEM column 1 and the FIB column 6 are at a ground potential and a negative voltage $V_d$ is applied to the sample 9. As a result, a deceleration electric field for the irradiation electron beam is generated between the SEM column 1 and the sample 9, so that the resolution of the SEM can be improved. A negative voltage to be applied to the sample 9 in order to improve the resolution is preferably set so that the potential difference between the sample 9 and the end of the objective lens 5 of the SEM is 1 kV or more, and when the potential difference is higher, the resolution improvement effect improves more greatly. However, a suitable voltage value can be changed depending on the working distance (WD) between the sample 9 and the end portion of the objective lens 5, so the present invention is not limited thereto.

When the electron beam or the ion beam irradiates the sample 9, the signal electron is detected by the detector 3 installed in the SEM column 1. A SEM image or a SIM image is obtained based on the detection signal with the detector 3.

For example, the detector 3 has an annular detection surface rotationally symmetrical with respect to the SEM optical axis 16. The detector 3 may have a plurality of detection surfaces or may detect the signal electrons discriminating according to the trajectory of the signal electron.

In this case, images corresponding to the energy and the angle of the signal electron when emitted from sample 9 can be acquired. A conversion electrode may be installed at the same position as the detection surface of detector 3, and a charged particle generated when the signal electron collides with the conversion electrode may be detected by the detector installed near the conversion electrode, so that a similar image can be obtained. A defector based on electric field or magnetic field may be arranged in the SEM column 1 and a signal electron may be introduced to the detector installed outside of the SEM optical axis 16 by using deflection effect.

The end electrode 11 is installed at the end position of the objective lens 5 of the SEM. The arrangement of the end electrode 11 is as described in the first embodiment. The end electrode 11 is electrically insulated from the objective lens magnetic path 51. The FIB-SEM also has an end electrode voltage source 12 for applying a voltage to the end electrode 11. Although it is desirable that the end electrode 11 has an axisymmetric electrode shape with respect to the SEM optical axis 16, the end electrode 11 is not limited thereto depending on the shape of the end of the FIB column 6. The end electrode 11 may be magnetically coupled with the objective lens magnetic path 51 of the SEM. The objective lens magnetic path 51 and the end electrode 11 may be configured to function as one magnetic circuit.

An electric field correction electrode 13 for correcting the electric field distribution formed near the sample 9 is installed at the position near the end of the FIB column 6. The FIB-SEM has an electric field correction electrode voltage source 14 for applying voltage to the electric field correction electrode 13. The arrangement of the electric field correction electrode 13 is as described in the first embodiment. More specifically, the electric field correction electrode 13 is installed between the FIB column 6 and the sample 9. In addition, the electric field correction electrode 13 is installed on the opposite side of the SEM optical axis 16 with the FIB column 6 in between.

It is desirable that the electric field correction electrode 13 is electrically insulated from the FIB column 6. However, essentially the same effects as the present embodiment can be obtained even when the electric field correction electrode 13 is electrically connected to the FIB column 6 and the potential of the electric field correction electrode 13 is the same as that of the FIB column 6.

The electric field correction electrode 13 may be provided with a position moving mechanism for changing the position of the electrode. Depending on the position moving mechanism, the position of the electric field correction electrode 13 may be changed according to the sample shape, the sample inclination angle, and the situation of other components installed in the sample chamber. This allows the position of the electric field correction electrode 13 to be changed flexibly according to the situation in the sample chamber.

Figure 7:
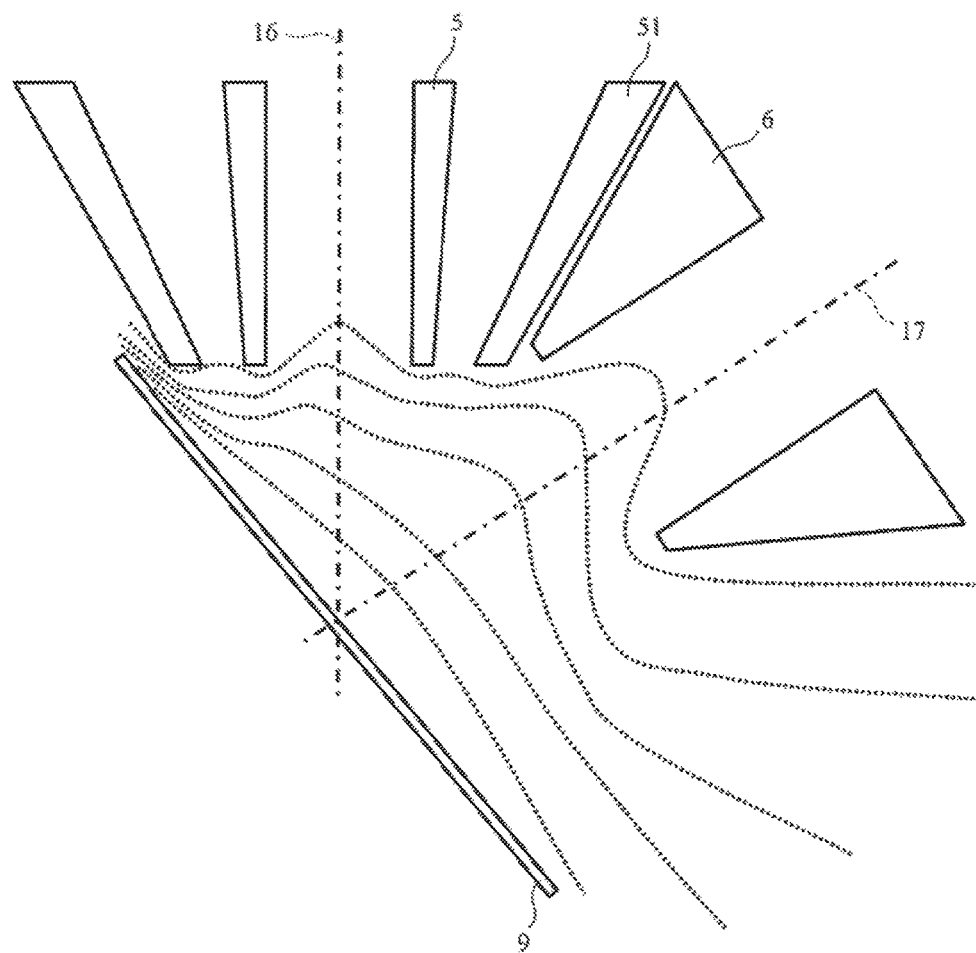
FIG. 7 is a diagram for explaining a distribution of equipotential lines in a conventional FIB-SEM.

FIG. 7 is a diagram for explaining a distribution of equipotential lines in a conventional FIB-SEM. FIG. 7 is a conceptual view illustrating the vicinity of the sample in the case where sample 9 is inclined with respect to the SEM column 1 in the conventional FIB-SEM equipped with an SEM column having a retarding optical system.

The retarding optical system is used in which the objective lens magnetic path 51 of the SEM and FIB column 6 are set to the ground potential and the voltage is applied to the sample 9 to make it into a negative potential. In this case, as illustrated in FIG. 7, the equipotential line is distorted and becomes a nonaxisymmetric distribution with respect to the SEM optical axis 16 and the FIB optical axis 17. The distribution of this equipotential line deflects the orbit of irradiation electron beam, irradiation ion beam, signal electron. The irradiation electron beam and the irradiation ion beam reach a position different from the point that is assumed when there is no leakage electric field in the vicinity of the sample 9.

The orbit change by the leakage electric field depends on the end shape of the SEM column 1 and the end shape of the FIB column 6, but for example, a certain typical shape is assumed. When a potential difference of 1 kV is provided between the sample 9 and both of the columns, the electron beam which irradiates the sample 9 with an energy of about 1 keV reaches a position 500 µm or more away from the desired position on the sample 9. Most of the signal electrons generated from the sample 9 collide with the structure near the end of the SEM column 1 or head toward the FIB column 6. Therefore, the signal electron does not reach the detector in the SEM column for detecting the signal electron passing through the objective lens 5. In addition, due to the electric field distribution non-axisymmetric with respect to the SEM optical axis 16, the objective lens aberration of the SEM increases and the resolution of the irradiation electron beam deteriorates. In particular, coma and astigmatism remarkably increase. Although astigmatism can be corrected using an astigmatism corrector, coma cannot be corrected.

Figure 8:
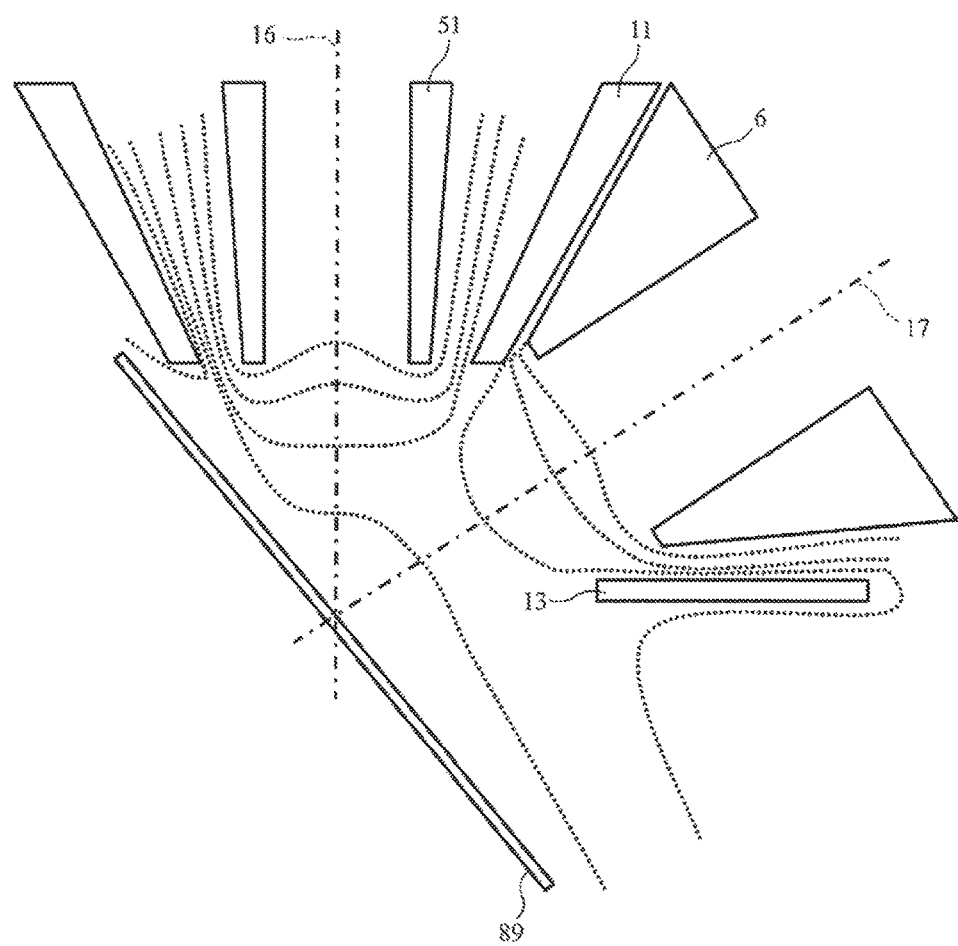
FIG. 8 is a diagram for explaining a distribution of the equipotential lines in the composite charged particle beam device according to the second embodiment.

FIG. 8 is a diagram for explaining the distribution of equipotential lines in the FIB-SEM according to the present embodiment. FIG. 8 is a conceptual view illustrating the vicinity of the sample when the end electrode 11 is placed at the end position of the objective lens 5 of the SEM and the electric field correction electrode 13 is arranged near the end position of the FIB column 6.

By applying a negative voltage to the end electrode 11 and the electric field correction electrode 13, it is possible to simultaneously perform the correction so that the electric field around the SEM optical axis 16 and the FIB optical axis 17 attains a symmetric distribution with respect to the axis. In the example of FIG. 8, an appropriate negative voltage is applied to the end electrode 11 and the electric field correction electrode 13. By applying the voltage to the end electrode 11 and the electric field correction electrode 13, the electric field on the path of the irradiation electron beam becomes an equipotential line close to axis symmetry with respect to the SEM optical axis 16, and the electric field on the path of the irradiation ion beam is an equipotential line close to axis symmetry with respect to the FIB optical axis 17. As a result, the position on the sample 9 where the irradiation electron beam and irradiation ion beam reach is improved as compared with the case where any voltage is not applied to the electrode (FIG. 7). The resolution can be improved by reducing the objective lens aberration of the SEM.

In addition, by optimizing the shape and the arrangement of the electric field correction electrode 13, the trajectory of the signal electron can be appropriately directed into the SEM column 1.

It is desirable that the voltage be applied to each of the electrodes 11, 13 so that the end electrode 11 and the electric field correction electrode 13 have lower potentials than the sample 9. This makes it possible to correct to a more suitable electric field. For example, a negative voltage of 1 kV is assumed to be applied to the sample 9 as a retarding voltage. In this case, typically, the voltage is applied to each of the electrodes 11, 13 so that the end electrode 11 and the electric field correction electrode 13 attain a negative potential of about 100 V with respect to the sample 9, and as a result, the change in the arrival position of the irradiation electron beam can be reduced to one fifth or less as compared with the case where the voltage is not applied. In addition, the signal electron can be properly guided into the SEM column 1.

In the present embodiment, the configuration using the objective lens 5 of the semi-in lens type has been used for the explanation, but even if an objective lens of an out lens type is used for observation of a magnetic substance sample and simultaneous observation with the FIB, these are similar in principle, and the same effects can be obtained. A configuration that can switch the leakage status of the magnetic field is made by combining an out lens type objective lens without magnetic leakage and a semi-in lens type or a single pole type objective lens with magnetic leakage, so that observation can be performed according to the application.

Third Embodiment

In the first and second embodiments, the configuration has been explained in which a negative voltage is applied to both of the end electrode 11 installed at the end of the SEM column 1 and the electric field correction electrode 13 disposed near the end of the FIB column 6. According to this configuration, it is possible to improve the adverse effect on the SEM and the performance due to the asymmetrical electric field. In principle, when an a negative voltage is applied to the end electrode 11, the leakage electric field is reduced, and the asymmetry with respect to the SEM optical axis 16 can be alleviated. However, this weakens the deceleration electric field, and as a result, the focal length of the electrostatic lens becomes longer than that when the voltage is not applied to the end electrode 11. As a result, chromatic aberration and spherical aberration of the SEM are increased, and it becomes impossible to maximize the observation performance originally provided. Therefore, in the present embodiment, a method for solving a similar problem is described by using the electric field correction electrode 13 and a control device for controlling the voltage applied to the electric field correction electrode 13 without using the end electrode.

In the FIB-SEM equipped with the SEM using the deceleration optical system, the adverse effect on the SEM performance and the FIB performance due to the disorder of the electric field distribution caused by the asymmetric structure has already been explained in the first and second embodiments. In order to improve these adverse effects, it is sufficient that the symmetry of the electric field with respect to the SEM optical axis 16 may be maintained during SEM observation, and in FIB processing, symmetry of the electric field with respect to the FIB optical axis 17 may be maintained.

Figure 9:
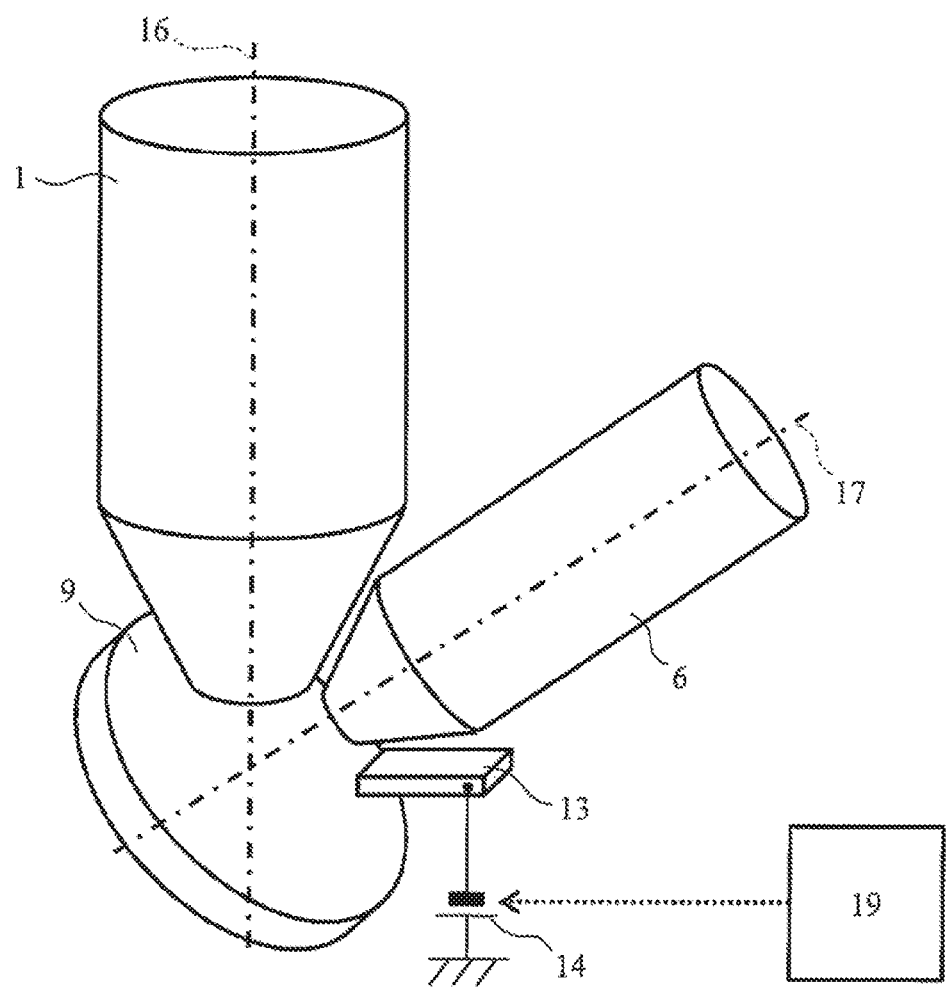
FIG. 9 is a schematic configuration diagram illustrating a composite charged particle beam device (FIB-SEM) according to a third embodiment.

FIG. 9 is a schematic configuration diagram illustrating a composite charged particle beam device (FIB-SEM) according to the third embodiment. The FIB-SEM has a deceleration optical system using the boosting method or the retarding method. The electric field correction electrode 13 is disposed between the FIB column 6 and the sample 9 and on the opposite side to the SEM column 1 with respect to the FIB optical axis 17 (opposite to the SEM optical axis 16 with the FIB column 6 in between). The FIB-SEM has an electric field correction electrode voltage source 14 for applying voltage to the electric field correction electrode 13 and a voltage control unit 19 for controlling the voltage applied to the electric field correction electrode 13. The voltage control unit 19 may be mounted on the control unit 20 described above.

In the case where a deceleration optical system is used, asymmetry occurs in the electric field distribution when there is an axially asymmetric structure. This adversely affects the SEM performance and the FIB performance. On the other hand, by applying an appropriate voltage $V_{sem}$ to the electric field correction electrode 13, the electric field in the vicinity of the sample 9 can be made symmetrical with respect to the SEM optical axis 16. At this time, the irradiation electron beam of the SEM is converged and induced to a desired position on the sample. In addition, the signal electron is properly guided to the detector 3 located in the SEM column 1. The voltage $V_{sem}$ is set based on the sample arrival position of the irradiation electron beam and the amount of the signal electron that arrives at the detector 3 in the SEM column of the signal electron generated when the electron beam irradiates the sample 9.

Likewise, by applying another appropriate voltage $V_{FIB}$ to the electric field correction electrode 13, the electric field can be brought into the vicinity of the sample 9 symmetrically with respect to the FIB optical axis 17. At this time, the irradiation ion beam is focused and induced at the desired position on the sample. The voltage $V_{FIB}$ is set based on the sample position where the irradiation ion beam arrives.

Here, the voltage control unit 19 controls the voltage applied to the electric field correction electrode 13 according to the type of the charged particle line irradiating the sample 9. More specifically, the FIB-SEM has a mechanism to switch between the irradiation electron beam and the irradiation ion beam irradiating the sample 9. The voltage control unit 19 applies the voltage $V_{FIB}$ to the electric field correction electrode 13 when the irradiation ion beam irradiates to the sample 9. On the other hand, the voltage control unit 19 applies the voltage $V_{sem}$ to the electric field correction electrode 13 when the irradiation electron beam irradiates the sample 9. The voltage control unit 19 switches the voltage $V_{FIB}$ and the voltage $V_{sem}$ in accordance with the timing of irradiation of the charged particle line. This makes it possible to improve the SEM performance during SEM observation and the FIB performance in FIB processing.

In this configuration, in the configuration in which the end electrode 11 is not provided in the SEM (configuration without voltage application to the end electrode), the asymmetry of the electric field in the vicinity of sample 9 can be alleviated. Therefore, it is possible to make an observation that maximizes the original performance of the SEM. For example, this is particularly useful to observe the final state of the sample 9 after the processing with the FIB.

When only the electric field correction electrode 13 is used, it is impossible to simultaneously improve the performance of the SEM and the FIB in principle. In contrast, in the present embodiment, a mechanism is provided to switch between the irradiation electron beam and the irradiation ion beam irradiating the sample 9. The voltage control unit 19 applies a voltage corresponding to each of the electric field correction electrode 13 according to the type of the charged particle line irradiating the sample.

The present invention is not limited to the embodiments described above, but includes various modifications. The above embodiments have been described in details in order to explain the present invention in an easy-to-understand manner and are not necessarily limited to those having all the configurations described therein. A part of a configuration of an embodiment may be replaced by a configuration of another embodiment. A configuration of an embodiment may be added to a configuration of another embodiment. Further, with respect to a part of the configuration of each embodiment, another configuration can be added, deleted, or replaced.

Although the FIB-SEM embodiment has been described above, the present invention can also be applied to a composite charged particle beam device combining two or more other charged particle beam devices without departing from the gist of the present invention.

The processing of the above-mentioned control units 19 and 20 can also be realized by software program code which implements these functions. In this case, a storage medium storing the program code is provided to a system or a device, and a computer (or a CPU or an MPU) of the system or the device reads the program code stored in the storage medium. In this case, the program code itself read out from the storage medium realizes the function of the above-mentioned embodiment, and the program code itself and the storage medium storing the program code constitute the present invention. For example, a flexible disk, a CD-ROM, a DVD-ROM, a hard disk, an optical disk, a magneto-optical disk, a CD-R, a magnetic tape, a nonvolatile memory card, a ROM or the like is used as a storage medium for supplying such program code.

The processes and techniques described herein are not inherently related to any particular device, and can be implemented by any suitable combination of components. Furthermore, various types of general-purpose devices can be used. In some cases, it may be beneficial to construct a dedicated device to perform the processing described here. More specifically, parts of the control units 19 and 20 described above may be realized with hardware using electron components such as, for example, integrated circuits.

Further, in the above-described embodiment, only control lines and information lines which are considered to be required for the sake of explanation are shown, and not all the control lines and information lines are illustrated as a product. All the configurations may be connected with each other.

REFERENCE SIGNS LIST

1 SEM column
2 electron gun
3 detector
4 tubular electrode
5 objective lens
51 objective lens magnetic path
6 FIB column
7 ion gun
8 FIB focusing lens
9 sample
10 sample table
11 end electrode
12 end electrode voltage source
13 electric field correction electrode
14 electric field correction electrode voltage source
15 boosting voltage source
16 SEM optical axis
17 FIB optical axis
18 retarding voltage source
19 voltage control unit
20 control unit

The invention claimed is:
1. A composite charged particle beam device comprising:
a sample table on which a sample is placed;
an ion beam column;

an electron beam column including a deceleration optical system and a detector in a column; and an electric field correction electrode provided around an end portion of the ion beam column, and that corrects an electric field distribution formed around the sample, wherein the electric field correction electrode is located between the sample and the ion beam column and at an opposite side of the electron beam column with respect to an optical axis of the ion beam column.

2. The composite charged particle beam device according to claim 1, further comprising an end electrode around an end portion of the electron beam column.

3. The composite charged particle beam device according to claim 2, wherein the end electrode has an axisymmetric shape with respect to the optical axis of the electron beam column.

4. The composite charged particle beam device according to claim 2, further comprising a control unit that controls a voltage applied to the electric field correction electrode and the end electrode, wherein the control unit controls a voltage applied to the end electrode and a voltage applied to the electric field correction electrode based on a potential difference between the sample and the electron beam column.

5. The composite charged particle beam device according to claim 2, wherein the electric field correction electrode and the end electrode are configured to apply the same voltage, and the electric field correction electrode and the end electrode are connected to a common voltage source.

6. The composite charged particle beam device according to claim 1, further comprising a control unit that controls a voltage applied to the electric field correction electrode, wherein the control unit controls a voltage applied to the electric field correction electrode based on a potential difference between the sample and the electron beam column.

7. The composite charged particle beam device according to claim 1, wherein a maximum value of an absolute value of a component of an electric field generated by the electron beam column and on the optical axis of the ion beam column in a direction perpendicular to the optical axis has a value of 50 kV/m or more.

8. The composite charged particle beam device according to claim 1, wherein the sample table is configured to be able to hold the surface of the sample in at least two directions that include a direction opposing the optical axis of the ion beam column and a direction opposing the optical axis of the electron beam column.

9. The composite charged particle beam device according to claim 1, wherein an irradiation energy from the electron beam column is 0.1 to 2 keV, and a sample surface can be observed where an end of the electron beam column and a surface of the sample are away by a distance of 5 to 20 mm.

10. The composite charged particle beam device according to claim 1, wherein a position of the electric field correction electrode is capable of being changed with respect to the sample.

11. The composite charged particle beam device according to claim 1, further comprising a control unit that controls a voltage applied to the electric field correction electrode, wherein when an ion beam from the ion beam column irradiates the sample, the control unit applies a first voltage to the electric field correction electrode, and when an electron beam from the electron beam column irradiates the sample, the control unit controls a second voltage to the electric field correction electrode.

12. The composite charged particle beam device according to claim 11, wherein the first voltage is set based on an irradiation position where the ion beam irradiates the sample, and the second voltage is set based on an irradiation position where the electron beam irradiates the sample and an intensity with the detector detecting a signal electron generated when the electron beam irradiates the sample.

13. The composite charged particle beam device according to claim 1, wherein the ion beam column is a focusing ion beam column, and the electron beam column is a scanning electron microscope column.

14. The composite charged particle beam device according to claim 1, wherein the deceleration optical system is a boosting optical system constituted by an electrode arranged along an objective lens in the electron beam column.

15. The composite charged particle beam device according to claim 1, wherein the deceleration optical system is a retarding optical system constituted by an electric power source applying a voltage to the sample or the sample table.

\* \* \* \* \*